United States Patent
Troia et al.

(10) Patent No.: US 11,378,603 B2
(45) Date of Patent: Jul. 5, 2022

(54) VOLTAGE OR CURRENT DETECTOR FOR A MEMORY COMPONENT

(71) Applicant: Micron Technology, Inc., Boise, ID (US)

(72) Inventors: Alberto Troia, Munich (DE); Antonino Mondello, Messina (IT)

(73) Assignee: Micron Technology, Inc., Boise, ID (US)

( * ) Notice: Subject to any disclaimer, the term of this patent is extended or adjusted under 35 U.S.C. 154(b) by 267 days.

(21) Appl. No.: 16/625,422

(22) PCT Filed: May 31, 2019

(86) PCT No.: PCT/IB2019/000468
§ 371 (c)(1),
(2) Date: Dec. 20, 2019

(87) PCT Pub. No.: WO2020/240230
PCT Pub. Date: Dec. 3, 2020

(65) Prior Publication Data
US 2021/0405096 A1    Dec. 30, 2021

(51) Int. Cl.
*G01R 19/257* (2006.01)
*G01R 19/25* (2006.01)
*G11C 5/14* (2006.01)
*G11C 29/50* (2006.01)

(52) U.S. Cl.
CPC ....... *G01R 19/257* (2013.01); *G01R 19/2509* (2013.01); *G11C 5/143* (2013.01); *G11C 5/147* (2013.01); *G11C 29/50* (2013.01); *G11C 2029/5004* (2013.01); *G11C 2029/5006* (2013.01)

(58) Field of Classification Search
CPC .. G01R 19/257; G01R 19/2509; G01R 19/30; G11C 5/143; G11C 5/147; G11C 29/50; G11C 2029/5004; G11C 2029/5006
USPC .......................................................... 702/64
See application file for complete search history.

(56) References Cited

U.S. PATENT DOCUMENTS

| 2009/0157340 A1 | 6/2009 | Gopalan et al. |
| 2012/0229169 A1 | 9/2012 | Nguyen et al. |
| 2021/0327526 A1* | 10/2021 | Troia ..................... G11C 29/56 |

OTHER PUBLICATIONS

International Search Report and Written Opinion from related international application No. PCT/IB2019/000468, dated Oct. 17, 2019, 16 pages.

* cited by examiner

*Primary Examiner* — Son L Mai
(74) *Attorney, Agent, or Firm* — Brooks, Cameron & Huebsch, PLLC

(57) ABSTRACT

The present disclosure relates to a detector comprising a comparator receiving on a voltage input a voltage value to be detected; a digital to analog converter coupled to a reference voltage potential having an output connected to another input of the comparator; and a Finite State Machine receiving an output of the comparator and producing digital outputs for inputs of a memory controller.

18 Claims, 6 Drawing Sheets

FIG. 1 – PRIOR ART

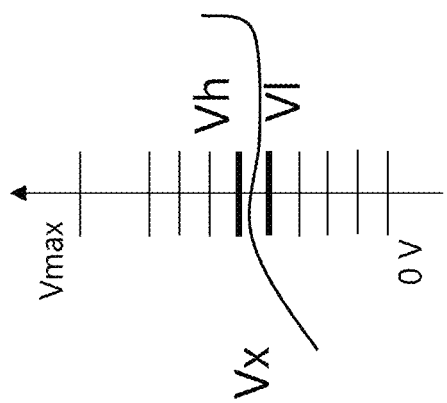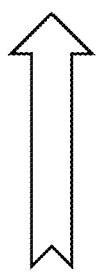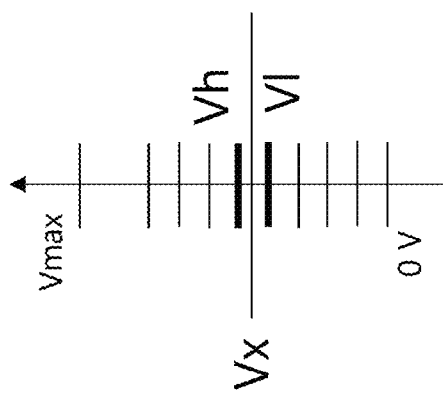
FIG. 2

VOLTAGE OR CURRENT DETECTOR FOR A MEMORY COMPONENT

PRIORITY INFORMATION

This application is a National Stage Application under 35 U.S.C. § 371 of International Application Number PCT/IB2019/000468, filed on May 31, 2019, the contents of which are incorporated herein by reference.

TECHNICAL FIELD

The present disclosure relates in general to apparatuses and methods for memory management and more particularly to voltage or current detector for a non-volatile memory component that is coupled to a host device or to a System-on-Chip.

BACKGROUND

Non-volatile Flash memories are today one of the fundamental building blocks in modern electronic systems, including the SoC devices for automotive applications, in particular for Real Time Operating Systems (RTOS). Their performance in terms of speed, consumption, alterability, nonvolatility and the increasing importance of system reconfigurability have pushed up to now for flash memory integration in System-on-Chip (SoC) devices.

However, with the current technologies the embedded memory portion is becoming the largest circuit portion in a SoC and it is not appropriate to increase their size to more than 128 Mbit since it is very difficult to manage the whole embedded memory structure when the lithography node is below 28 nm.

In many applications it would be highly desirable to enlarge the size of the memory portion but it would be necessary to provide a new manner of coupling the SoC and the embedded or associated memory component. Moreover, it would be necessary to provide a more efficient manner to exchange signals and measured values between the memory portion and the controller of the SoC.

BRIEF DESCRIPTION OF THE DRAWINGS

FIG. 2 shows a first and a second diagram reporting a measure of voltage value Vx affected by noise and more regular and stable value, respectively;

DETAILED DESCRIPTION

Figure 1:
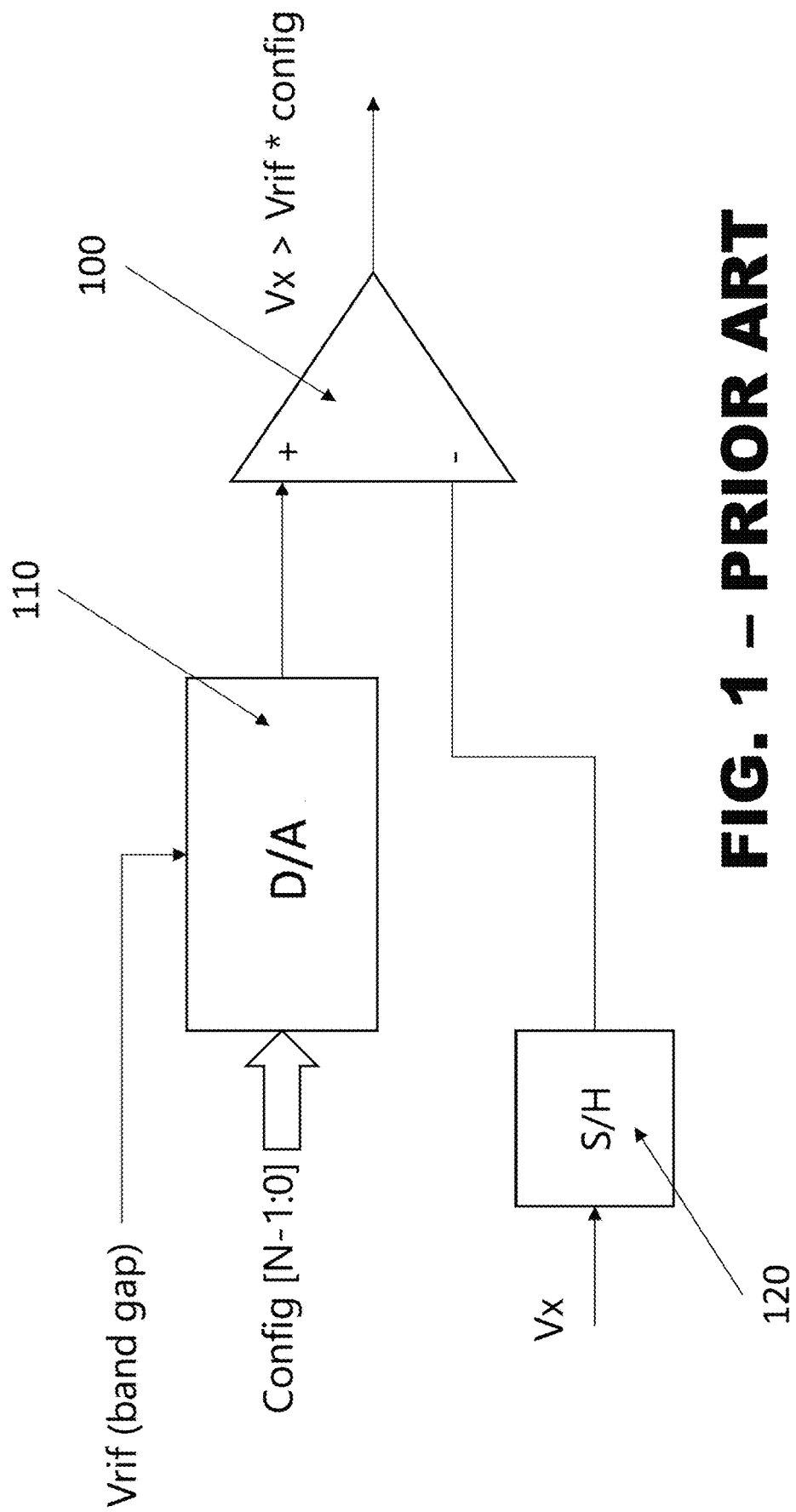
FIG. 1 is a schematic view of a known digital voltage detector for memory components realized according to a prior art solution.

Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered.

Non-volatile memory is available in a wide variety of technologies, including flash memory (e.g., NAND and NOR), Read Only Memory (ROM), Electrically Erasable Programmable ROM (EEPROM), Erasable Programmable ROM (EPROM), and resistance variable memory such as phase change random access memory (PCRAM), self-selecting chalcogenide-based memories, resistive random access memory (RRAM), 3D XPoint memory (3DXP) and magneto-resistive random access memory (MRAM), among others.

Memory devices can include large arrays of memory cells for storing data, frequently organized into rows and columns. Individual memory cells and/or ranges of memory cells can be addressed by their row and column. When a memory array is addressed, there may be one or more layers of address translation, to e.g., translate between a logical address utilized by a host device and a physical address corresponding to a location in the memory array.

For the regular operation of the memory array it is necessary to provide to the memory measured voltage and current values for managing the reading, writing and erasing phases of the memory cells.

Let's consider for instance a flash memory device coupled to a host device or associated to a SoC and including some circuit blocks shared with the SoC, for instance the read logic to implement the fetch/prefetch scheme and-or the branch prediction.

Some of these circuit blocks need to receive signals reporting voltage and/or current values detected in the memory component for correctly driving the reading, programming or erasing phases of the memory array.

More specifically, these circuit blocks need to have the power supply and signals advising that the power supply is correct. For instance, the signal can be a result of a comparison between a BandGap reference voltage, with proper voltage scale, and the external supply. This signal information is driven to the memory internal controller to execute correctly the required operation following a firmware. Similar consideration may be done with respect to a reference current.

The required voltage and/or current value are detected by specific circuit portions that operates as voltage or current detectors.

A Flash memory device is very sensitive to the power supply when it programs and erases the memory array in particular for data retention issues and for the reliability. The Flash array must be a very high reliable device able also to inform the SoC that something wrong is happening with the power supply. This task is assigned to a controller of the flash array (not shown) that is incorporated into the memory component.

Unfortunately, known standard voltage or current detectors are noise sensitive.

The current/voltage under measure cannot be stable during the measure time frame. Therefore, the measure could be not accurate.

Some embodiments provide a voltage or current detector to be used in a memory component coupled to a host device or embedded/associated to a System-on-Chip having a low sensitivity to a possible noise disturbing the measure.

In some embodiments the detector disclosed herewith provides just the value of the detected measure protecting the manner in which the detector has obtained such a measure, thus protecting the memory portion from possible hacker attack.

A further feature of the detector of the present disclosure is given by the capability of generating reference voltage or currents according to the operating needs of the memory portion wherein the detector has been incorporated.

FIG. 1 shows a schematic example of a prior art solution for detecting a voltage value in a memory portion, for instance a memory portion embedded in a complex System-on-Chip.

The detector shown in FIG. 1 is based on a Schmitt trigger comparator 100 receiving on one input the output of a digital to analogic or analog (D/A) converter 110.

This D/A converter 110 is coupled to a stable reference voltage potential Vrif generated for instance by an analogic bandgap generator with a proper configuration, i.e. a proper conversion factor, (not shown in the figures) and is driven by a digital input configuration signal Config.

According to the value of the digital input configuration signal the D/A converter 110 provides a modulated output value.

A sample and hold block 120 receives as input a voltage value Vx to be measured and applies its output to the other non-inverting input of the Schmitt trigger 1100.

The Schmitt trigger is a comparator circuit with hysteresis implemented by applying positive feedback to the non-inverting input of a comparator or differential amplifier. It is an active circuit which converts an analog input signal to a digital output signal. The circuit is considered a trigger because the output retains its value until the input changes sufficiently to trigger a change. In the non-inverting configuration, when the input is higher than a chosen threshold, the output is high. When the input is below a different (lower) chosen threshold the output is low, and when the input is between the two levels the output retains its value.

The output obtained from the Schmitt trigger is the voltage value Vx>Vrif*Config.

This structure however is very sensitive to supply variations because of its intrinsic Schmidt trigger configuration.

For example, FIG. 2 shows a first diagram reporting the variations of the input voltage Vx because of the noise disturbing the measure and a second diagram reporting a stable voltage value Vx that remains within a small range represented by a higher voltage value Vh and a lower voltage value Vl.

It would be desirable to obtain a stable measure of the voltage value Vx as shown by the second diagram and the detector of the present disclosure is structured to obtain such a result.

Figure 3:
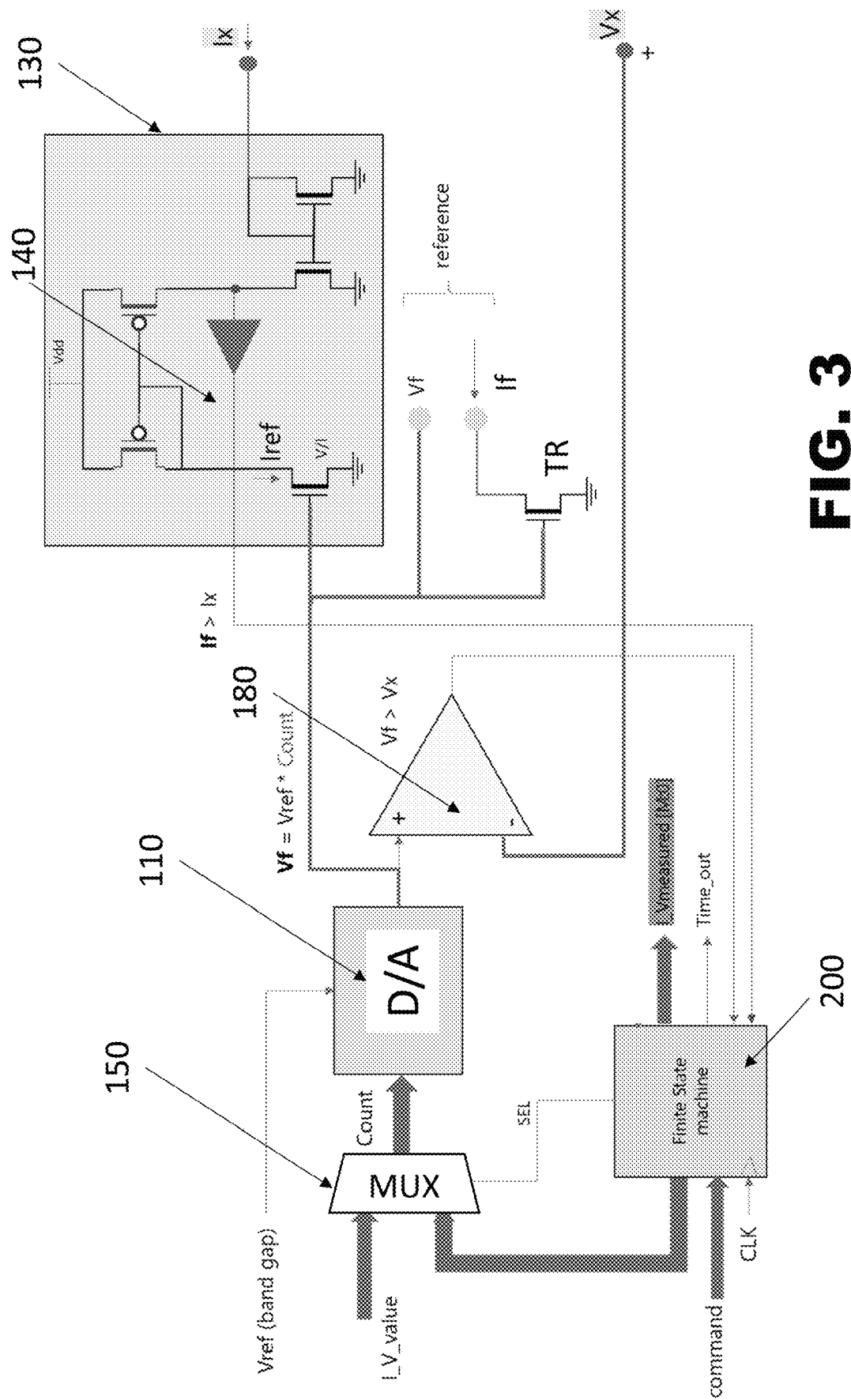
FIG. 3 is a schematic view of first embodiment of a voltage detector according to the present disclosure.

FIG. 3 shows a schematic view of one embodiment of a voltage detector according to the present disclosure. One embodiment of the present disclosure relates to a robust voltage or current detector for a memory component including as a basic structure a comparator 180 receiving on its non-inverting input (+) the output of a digital to analog D/A converter 110.

A first embodiment of the present disclosure relates to a voltage detector for a memory component having a memory controller, comprising:
 a comparator receiving on a voltage input a voltage value to be detected;
 a digital to analog converter coupled to a reference voltage potential and having an output connected to other input of said comparator;
 a Finite State Machine receiving the output of said comparator and producing digital outputs for the inputs of said memory controller.

A second embodiment of the present disclosure relates to a current detector for a memory component having a memory controller, comprising:
 a digital to analog converter coupled to a reference voltage potential and having an output connected to a transistor of a current to voltage converter, the current to voltage converter configured to receive as input a current value to be detected;
 a Finite State Machine receiving the output of said current to voltage converter and producing digital outputs for the inputs of said memory controller.

The D/A converter 110 is coupled to a stable reference voltage potential Vref generated for instance by an analogic bandgap generator and receives a digital input signal Count.

The reference voltage Vref is to be considered as an external voltage value. A normal value for a bandgap reference could be about 1.2 Volt even if this value is just indicative.

The output of the D/A converter 110 is an analogic value Vf=Vref*Count and is applied to the non-inverting input (+) of the comparator 180.

The comparator 180 has a second inverting (−) input receiving the voltage value Vx to be measured. The example reported herewith should be considered as a schematic indication that the inverting input of the comparator 180 is connected to a node point or to a terminal of the memory portion or component wherein a voltage potential Vx is applied and such a potential must be measured with great precision obtaining a value not affected by noise.

This basic structure of the comparator 180 and converter 110 has been further improved by the association of a Finite State Machine (FSM) 200. It worthwhile to repeat that the voltage detector using the comparator 180 and the current detector using the converter 130 do not work at the same time even if they are shown in both FIGS. 3 and 5.

The Finite State Machine 200 is a complex logic portion capable to execute algorithms. In the subsequent part of the present disclosure we will provide an example of an algorithm executed by the Finite State Machine 200.

This Finite State Machine 200 operates according to a clock signal CLK of the memory component and received on one input. The FSM receives also as a further input a Command signal issued by the internal memory controller to execute properly the operation that the internal firmware can require depending on the access phase to the memory array. As an alternative, the command signal may arrive from a host device coupled to the memory component or issued by a controller of the System-on-Chip hosting the embedded memory component A multiplexer 150 is provided between the Finite State Machine 200 and the digital input of the D/A converter 110. A selection signal SEL is produced by the Finite State Machine 200 to drive the multiplexer 150 and select the proper path for the input signal to the output of the multiplexer.

The output of the multiplexer 150 is a Count digital input for the D/A converter 110.

This multiplexer 150 receives as a first input a logic value corresponding to a voltage or a current measure and on a second input the output of the Finite State Machine 200.

The output value of the comparator 180 is applied as a feedback input to the Finite State Machine 200. This output value Vf is outputted when it is greater than a voltage value Vx to be measured.

In other words, the output value Vf of the comparator 180 is triggered when the voltage value Vf is greater than the voltage value Vx to be measured.

Moreover, if the measure is performed for a time interval of a certain duration it is possible to obtain an average value Vx that is less and less affected by possible noise.

In this respect, the Finite State Machine 200 is settable with a programmable Time_out value that represents the max duration of the time interval for performing the measure of the voltage value Vx.

Just to give an example of a possible algorithm that the Finite State Machine 200 may execute to measure a voltage value Vx, we are reporting hereinafter a list of instructions and parameters that have been adopted for reaching the required measure.

```
N = max measures attempt
Wait (T0) u-second        (Vx is hopefully a stable value)
N++;
The FSM looking for the counter value that provides Vf>Vx
Count_H ← counter
Count_L ← counter − 1
Set a Timer ΔT = T1
do {
    // Is Vx stable? Is it out of ΔV?
    if ((Vrif * Count_H) <Vx || (Vrif * Count_L) > Vx )
        wait (T2) go to step 1
    } while ((elapsed time < ΔT ) || k>N)
If (k<=N) I_Vmeasured [M:0] = [Vrif (Count_H)−Vrif (Count_L)]/2
Else Time_out ← 1
```

It should be noted that the Finite State Machine 200 finds the value in a sequential manner or, as an alternative, in a dichotomic way or with any other method that can speed up the finding of the final value.

Figure 4:
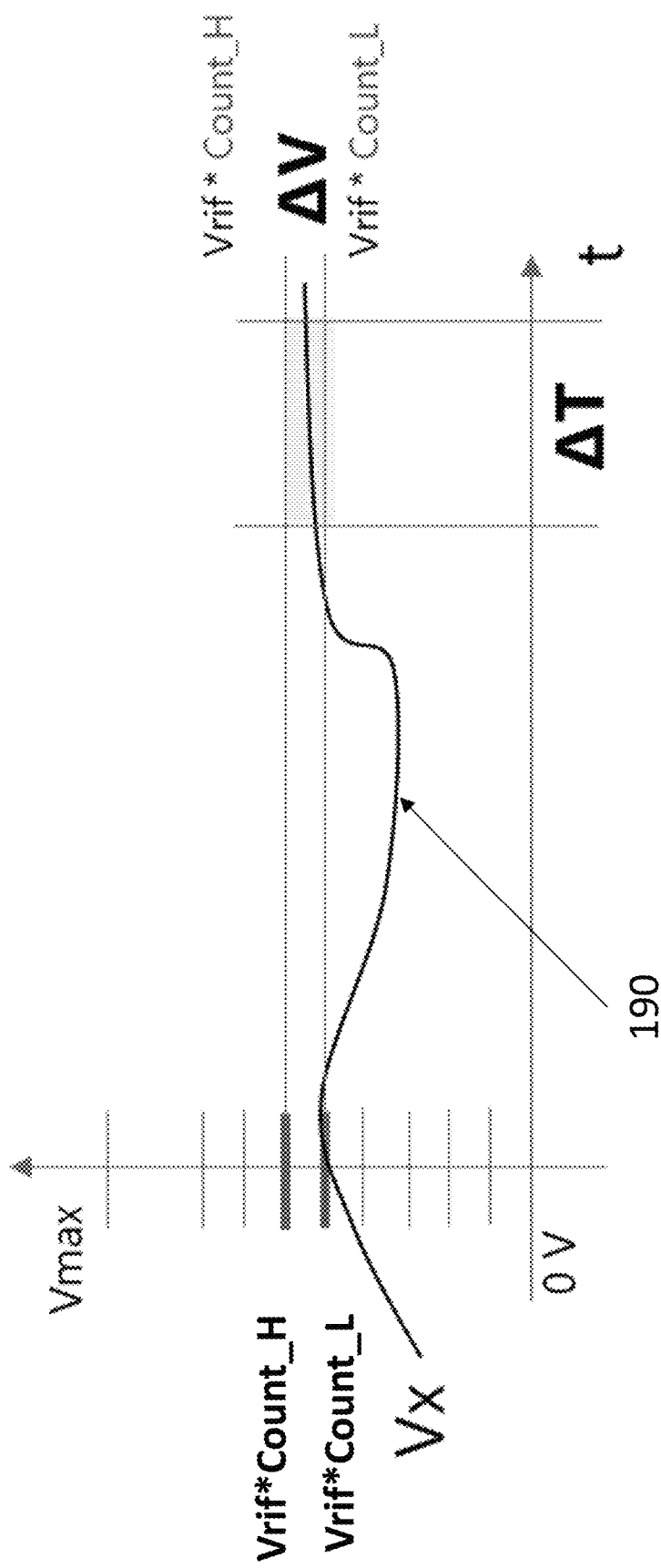
FIG. 4 is a diagram showing a measure of a voltage value Vx obtained with the detector of FIG. 3.

As shown in the diagram of FIG. 4, during the time interval ΔT the detected voltage value Vx remains substantially stable within an upper limit Vrif*Count_H and a lower limit Vrif*Count−L. The window delimited by the upper and lower voltage limits of the time interval ΔT is programmable by the user of the memory component.

Moreover, the FSM is always capable to detect the possible presence of noise since the detected voltage value Vx must remain within the upper and lower limits above reported and when the detected value is outside the expected range, like for instance in the portion of the diagram indicated by the number 190, the measure is repeated automatically.

The numeric value N represents the maximum number of attempts that the detector should perform for obtaining the required measured value Vx. The other time T0, T1 and T2 are time parameters measured from a common origin.

The reported parameters N, T0, T1, T2 are all programmable in the sense that their value may be set according to the quality and reliability of the measure to be performed. Even the time interval ΔT is a parameter that may be programmed.

Just to give an indication of a value assignable to ΔT it may be set in few dozens of milliseconds.

Figure 5:
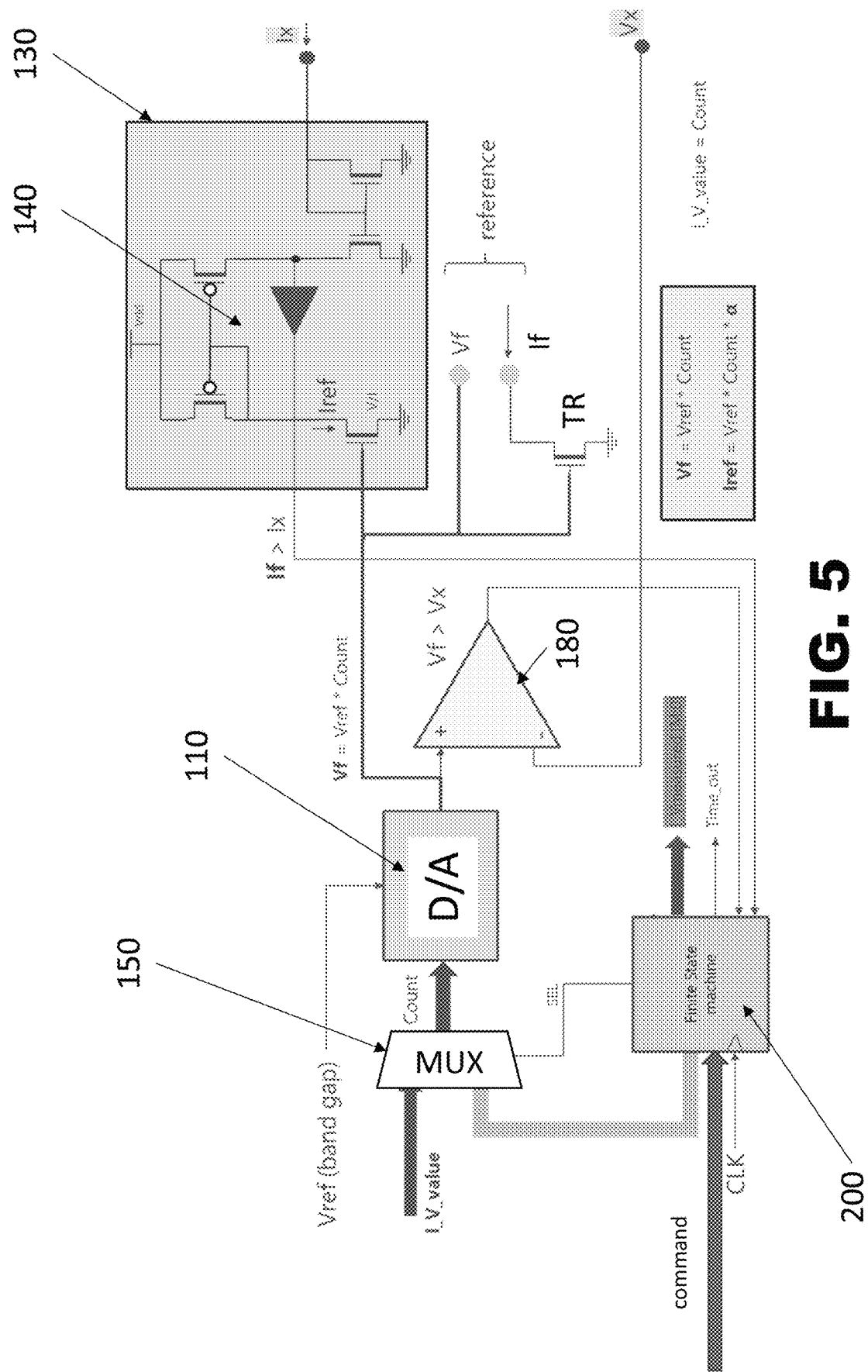
FIG. 5 is a schematic view of an embodiment of a current detector according to the present disclosure.

FIG. 5 is a schematic view of an embodiment of a current detector according to the present disclosure. The detector of the present disclosure may be used for measuring also a current value, for instance a current value Ix. Several elements in FIG. 5 are the same as those of FIG. 3 described above; however, some of them (such as voltage comparator 180) are not used during operation as current detection and measurement and reference current generation as better explained below.

However, the basic portion of the detector disclosed herewith is structured with the voltage comparator 180 and for this reason it has been adopted a converter 130 from current to voltage.

The structure of this converter 130 is based on a current mirror including a differential cell 140 comprising PMOS and NMOS transistors. The current-to-voltage converter 130 is also depicted in FIG. 3, however it is not used during voltage detection and measurement nor during reference voltage generation. Converter 130 and its functionality will be described below with reference to current detection and measurement and reference current generation.

One input of the current mirror is the current value Ix to be measured. In this respect, we must intend that current input terminal of the converter 130 corresponds to a node point or to a terminal of the memory portion or component wherein a current value Ix is flowing and such a current value must be measured with great precision obtaining a value not affected by noise.

For completeness sake it should be noted that the differential cell 140 of the current mirror includes a first leg associated to the input current value Ix and a second leg associated to the output of the D/A converter 110.

More particularly, the output of the D/A converter 110 is applied to a gate of an NMOS transistor of the second current mirror leg draining a reference current If. The voltage value Vf at the output of the D/A converter is proportional to the reference voltage Vref and is further applied to the gate terminal of a buffer transistor TR having conducting terminal linked between the reference current If node and a ground potential reference. Transistor TR further mirrors the current Iref in the second leg of the current-to-voltage converter 130, making it possibly available at its drain node.

The output of the voltage or current detector of the present disclosure is represented by a digital output of the FSM wherein a digital value I_Vmeasured [M:0] is presented to the outside world, for instance the SoC controller.

As previously disclosed with reference to the voltage detector, the Finite State Machine 200 receives as input an output value If outputted by the converter 130 and is capable to issue digital values for the input of the D/A converter 110. It worthwhile to repeat that the block 130 and 180 do not operate at the same time.

Similarly, to the previous schematic example of FIG. 3, the multiplexer 150 receives as input the signal output of the FSM 200 and as a further input a digital current/voltage value I_V_value.

Similarly, to the example of the voltage detector, it is proposed herewith an algorithm that the Finite State Machine 200 may execute to measure a current value Ix. The algorithm includes a list of instructions and parameters that have been adopted for reaching the required measure.

```
N = max measures attempt
Wait (T0) u-second        (Ix is hopefully a stable value)
N++;
The FSM looking for the counter value that provides If>Ix
Count_H ← counter
Count_L ← counter − 1
Set a Timer ΔT = T1
do {
    // Is Ix stable? Is it out of IV?
    if ((Vrif * Count_H * α) <Ix || (Vrif * Count_L * α) > Ix )
        wait (T2) go to step 3
    } while ((elapsed time < ΔT ) || k>N)
If (k<=N) I_Vmeasured [M:0] = α * [Vrif (Count_H)−Vrif
```

(Count_L)]/2
Else Time_out ← 1

As previously disclosed, the numeric value N represents the maximum number of attempts that the detector should perform for obtaining the required measured value Ix. The other time T0, T1 and T2 are time parameters measured from a common origin.

The reported parameters N, T0, T1, T2 are all programmable in the sense that their value may be set according to the quality and reliability of the measure to be performed. Even the time interval ΔT is a parameter that may be programmed.

Figure 6:
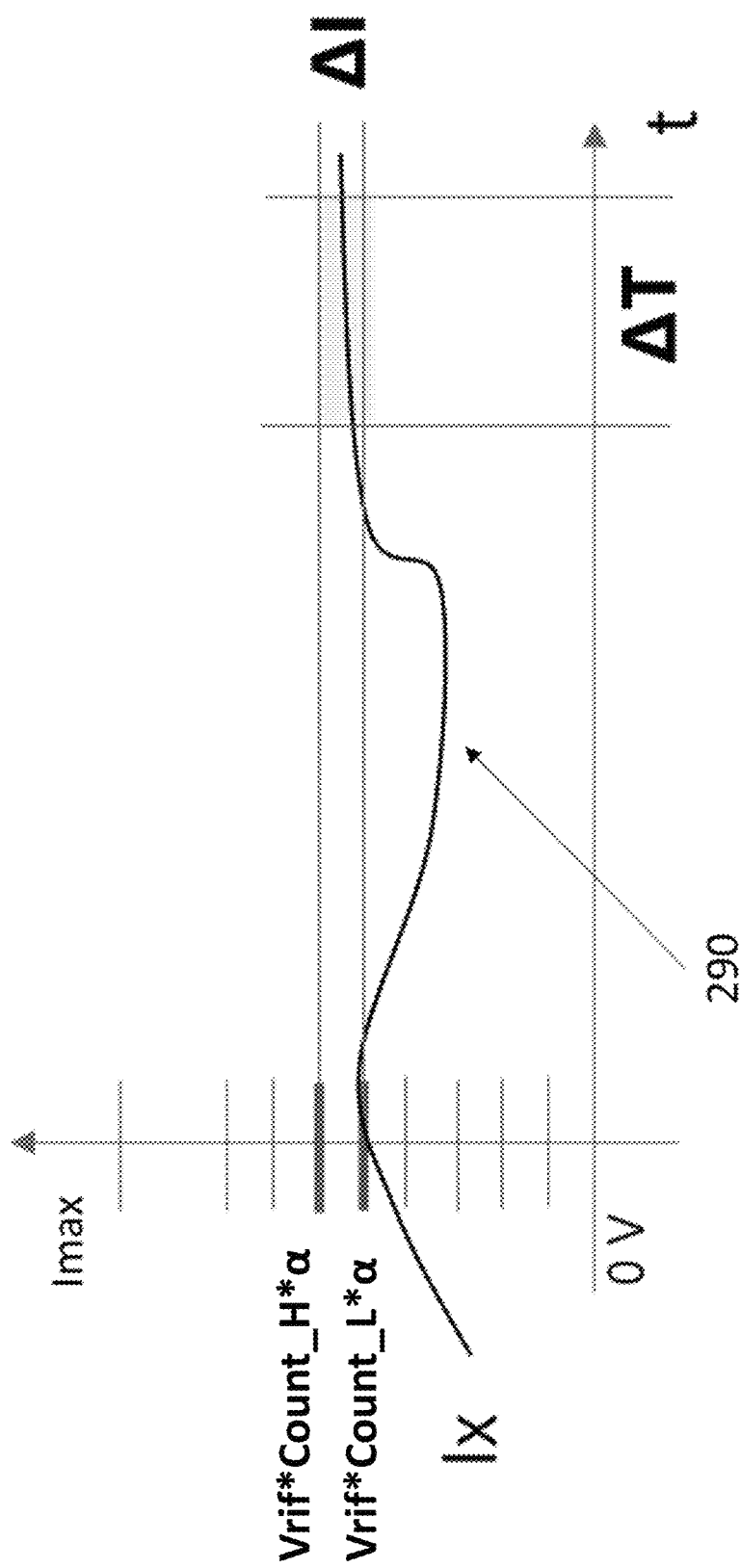
FIG. 6 is a diagram showing a measure of a current value Ix obtained with the detector of FIG. 3.

FIG. 6 is a diagram showing a measurement of a current value Ix obtained with the block of FIG. 5. As shown in the diagram of FIG. 6, during the time interval ΔT the detected current value Ix remains substantially stable within an upper limit given for instance by Irif*Count_H*α=Vrif*Count_H and a lower limit given by Irif*Count_L*α=Vrif*Count_L. The figure reports a scale factor α (alpha) to allow the proper comparison; α is a conversion factor from voltage to current (e.g., such that Vrif*Count_L*α corresponds to Irif*Count_L and Vrif*Count_H*α corresponds to Irif*Count_H). The window delimited by the upper and lower current limits of the time interval ΔT is programmable by the user of the memory component.

Moreover, the FSM is always capable to detect the possible presence of noise since the detected current value Ix must remain within the upper and lower limits above reported and when the detected value is outside the expected range, like for instance in the portion of the diagram indicated by the number 290, the measure is repeated automatically.

One of the advantages of the method of the present disclosure is given by the presence of a on board mechanism for measuring voltage values V and current values I related to the flash array without exposing the cells terminal to any contact from an external component, for instance a host device or a SoC to whom the memory is associated. This feature has the great advantage to permit to protect some technological secret not directly measurable from outside the memory component thus rendering the memory device more robust against attacks directed to detect process parameter hacking direct measure on flash cells.

In the previous description numerous specific details are discussed to provide a thorough and enabling description for embodiments of the present technology.

However, one skilled in the relevant art will recognize that the disclosure can be practiced without one or more of the specific details. In other instances, well-known structures or operations often associated with memory devices are not shown, or are not described in detail, to avoid obscuring other aspects of the technology. For example, several functional components of memory devices and/or memory systems that are well-known to those skilled in the art are not discussed in detail below (e.g., circuit components such as multiplexers and decoders, data structures such as address registers and data registers, etc.).

In general, it should be understood that various other devices, systems, and methods in addition to those specific embodiments disclosed herein may be within the scope of the present technology.

The invention claimed is:

1. A detector, comprising:
    a comparator receiving on a voltage input a voltage value to be detected;
    a digital to analog converter coupled to a reference voltage potential and having an output connected to another input of the comparator; and
    a Finite State Machine receiving an output of the comparator and producing digital outputs for inputs of a memory controller, wherein the Finite State Machine is configured to receive a command signal.

2. The detector of claim 1, further comprising a multiplexer between the digital outputs of the Finite State Machine and the inputs of the digital to analog converter.

3. The detector of claim 2, wherein the Finite State Machine is configured to issue a selection signal for enabling the multiplexer.

4. The detector of claim 1, wherein the operation of the Finite State Machine is scheduled by a clock signal of a memory component.

5. The detector of claim 1, wherein the voltage value to be detected is applied to an inverting input of the comparator.

6. The detector of claim 1, wherein the Finite State Machine is configured to emit a Time-out signal at the end of a measure.

7. The detector of claim 1 further comprising a current to voltage converter receiving as input a current value to be detected and having an output connected to the Finite State Machine.

8. The detector of claim 7, wherein the current to voltage converter includes a current mirror.

9. A detector, comprising:
    a digital to analog converter coupled to a reference voltage potential and having an output connected to a transistor of a current to voltage converter, the current to voltage converter configured to receive as input a current value to be detected; and
    a Finite State Machine receiving the output of the current to voltage converter and producing digital outputs for the inputs of a memory controller, wherein the Finite State Machine is configured to receive a command signal.

10. The detector of claim 9 further comprising a multiplexer between the digital outputs of the Finite State Machine and the transistor of the current to voltage converter.

11. The detector of claim 10, wherein the Finite State Machine is configured to issue a selection signal for enabling the multiplexer.

12. The detector of claim 9, wherein the operation of the Finite State Machine is scheduled by a clock signal of a memory component.

13. The detector of claim 9, wherein the Finite State Machine is configured to emit a Time-out signal subsequent to detection of the current value.

14. A detector, comprising:
    a comparator receiving on a voltage input a voltage value Vx;
    a digital to analog converter coupled to a reference voltage potential and having an output connected to another input of the comparator;
    a Finite State Machine receiving an output of the comparator and producing digital outputs for the inputs of a memory controller; and
    a current to voltage converter receiving as input a current value Ix to be detected and having an output connected to the Finite State Machine.

15. The detector of claim 14, wherein a multiplexer between the digital outputs of the Finite State Machine and the inputs of the digital to is driven by a further signal of the Finite State Machine.

16. A detector, comprising:
- a digital to analog converter coupled to a reference voltage potential and having an output connected to a transistor of a current to voltage converter, the current to voltage converter configured to receive as input a current value to be detected, wherein the current value to be detected is applied to a first leg of the current to voltage converter; and
- a Finite State Machine receiving the output of the current to voltage converter and producing digital outputs for the inputs of a memory controller.

17. A detector, comprising:
- a digital to analog converter coupled to a reference voltage potential and having an output connected to a transistor of a current to voltage converter, the current to voltage converter configured to receive as input a current value to be detected;
- a Finite State Machine receiving the output of the current to voltage converter and producing digital outputs for the inputs of a memory controller; and
- a comparator configured to receive as input a voltage to be detected and having an output connected to the Finite State machine.

18. A detector, comprising:
- a digital to analog converter coupled to a reference voltage potential and having an output connected to a transistor of a current to voltage converter including a current mirror, the current to voltage converter configured to receive as input a current value to be detected; and
- a Finite State Machine receiving the output of the current to voltage converter and producing digital outputs for the inputs of a memory controller.

* * * * *